US007982536B2

(12) United States Patent
Chao

(10) Patent No.: US 7,982,536 B2
(45) Date of Patent: Jul. 19, 2011

(54) SINGLE ENDED CLASS-D AMPLIFIER WITH DUAL FEEDBACK LOOP SCHEME

(75) Inventor: Jao-Chu Chao, Taipei (TW)

(73) Assignee: Eutech Microelectronics Inc., Taipei (TW)

( * ) Notice: Subject to any disclaimer, the term of this patent is extended or adjusted under 35 U.S.C. 154(b) by 68 days.

(21) Appl. No.: 12/562,685

(22) Filed: Sep. 18, 2009

(65) Prior Publication Data

US 2011/0068869 A1    Mar. 24, 2011

(51) Int. Cl.
*H03F 3/217*    (2006.01)
(52) U.S. Cl. ........................................ 330/251
(58) Field of Classification Search .............. 330/10, 330/207 A, 251

See application file for complete search history.

(56) References Cited

U.S. PATENT DOCUMENTS 6,998,910 B2 *    2/2006    Hezar et al. ............... 330/10
2007/0069814 A1 *    3/2007    Giotta et al. ............. 330/251

* cited by examiner

*Primary Examiner* — Robert Pascal
*Assistant Examiner* — Khiem D Nguyen
(74) *Attorney, Agent, or Firm* — patenttm.us

(57) ABSTRACT

A single-ended class-D amplifier with dual feedback loop scheme has a gain adjusting circuit, a second-order integrator, two comparators, a logic circuit, an output driver and an inverter. The output driver cooperates with the inverter to produce a differential signal. The differential signal is input to the second-order integrator to construct a dual feedback differential loop to eliminate noise of output signals of the class-D amplifier, and offer enhanced signal to noise and distortion ratio (SNDR).

5 Claims, 9 Drawing Sheets

SINGLE ENDED CLASS-D AMPLIFIER WITH DUAL FEEDBACK LOOP SCHEME

BACKGROUND OF THE INVENTION

1. Field of the Invention

The present invention relates to a single-ended class-D amplifier, and particularly to a single-ended class-D amplifier with dual feedback loop scheme.

2. Description of Related Art

Amplifiers can be categorized as class-A amplifiers, class-B amplifiers, AB-class amplifiers and class-D amplifiers. As the development of semiconductor technology, the class-D amplifiers with low power consumption have been applied in widespread applications, such as sound reinforcement system.

In comparison to AB-class amplifiers using linear signals, class-D amplifiers use pulse width modulation (PWM) technique to drive an inductive load device, wherein the PWM technique involves audio signals, PWM switch signals and harmonic signals. The PWM switch signals are applied to alternately turn on and off switching transistors of the class-D amplifier. Because the switches are either fully on or fully off, the power losses in the output devices are significantly reduced to ensure high power efficiency.

With reference to FIG. 5, a conventional single-ended class-D amplifier (70) with open loop scheme comprises a gain amplifier (71), a comparator (72), an oscillator (73), a logic circuit (74) and an output driver (75).

With further reference to FIG. 7, the gain amplifier (71) has an input terminal (Vi) for receiving an analog audio signal, amplifies the analog audio signal and transmits the amplified audio signal to the comparator (72). Upon the receipt of the amplified audio signal, the comparator (72) refers to an oscillating signal of the oscillator (73) to produce PWM signals (P, N). The logic circuit (74) based on the PWM signals (P, N) controls the output driver (75). The output driver (75) is adapted to connect to an inductive load device (60) via a low pass filter (80). The inductive load device (60), for example a speaker, receives the audio signal from the low pass filter (80) and restores sound accordingly.

With further reference to FIG. 6, the oscillating signal produced by the oscillator (73) is a high frequency signal. For example, the frequency of the oscillating signal may be 350 kHz if the audio signal is in the range from 20 Hz to 20 kHz. Noises (N1) existing in the audio signal can be shaped to higher frequency beyond the signal band, such that the noises (N1) can be eliminated by the low pass characteristic (81) of the low pass filter (80) to retain desired audio data (S1).

It is difficult to reduce the size of the class-D amplifier (70) since the class-D amplifier (70) requires an additional low pass filter (80) to filter the noises been shaped to higher frequency. Furthermore, amplification elements of the gain amplifier (71) and the comparator (72) will cause a noise floor this one kind of random noise. Therefore, when the audio signal is input to the gain amplifier (71), the dynamic noise is also amplified and incorporated into the amplified audio signals, which deteriorates the total harmonic distortion plus noise (THD+N) and signal to noise and distortion ratio (SNDR) of the audio signals.

With reference to FIG. 8, another conventional single-ended class-D amplifier (70a) with close loop scheme comprises a gain amplifier (71), a comparator (72), an oscillator (73), a logic circuit (74), an output driver (75) and a first-order feedback circuit (711).

The gain amplifier (71) has an input terminal (Vi) for receiving an analog audio signal, amplifies the analog audio signal and transmits the amplified audio signal to the comparator (72). Upon the receipt of the amplified audio signal, the comparator (72) refers to an oscillating signal from the oscillator (73) to produce PWM signals. The logic circuit (74) based on the PWM signals to generate driving signals to turn on or off the output driver (75).

The output driver (75) comprises a high-side switch circuit (751) and a low-side switch circuit (752) both connected to the logic circuit (74) to receive the driving signals. The high-side switch circuit (751) and the low-side switch circuit (752) are connected in series at a node as an output terminal (Do) of the class-D amplifier (70a) for connecting to an inductive load device (60).

The first-order feedback circuit (711) is connected between the node of the output driver (75) and the input terminal (Vi) of the gain amplifier (71).

Since the class-D amplifier (70a) has incorporated with the first-order feedback circuit (711), many non-ideal components in the class-D amplifier (70a) can be eliminated, including amplifier frequency limitations, amplifier noise, reference voltage noise, gain-bandwidth product limitations and switch device non-linearity. However, because the class-D amplifier (70a) only uses a single gain amplifier (71) to process the audio signal, the noise shaping capability of the class-D amplifier (70a) is limited.

To overcome the shortcomings, the present invention provides a single-ended class-D amplifier with the dual feedback loop scheme to mitigate or obviate the aforementioned problems.

SUMMARY OF THE INVENTION

An objective of the present invention is to provide single-ended class-D amplifier with the dual feedback loop scheme to offer good signal to noise and distortion ratio (SNDR).

To achieve the objective, the single-ended class-D amplifier with dual feedback loop scheme comprises a gain adjusting circuit, a second-order integrator, two comparators, a logic circuit, an output driver and an inverter. The second order integrator includes a first differential amplifier, two first RC circuits, a second differential amplifier and two second RC circuits.

Since the single-ended class-D amplifier has only one output terminal, the inverter is connected to the output terminal to construct a fully differential circuit configuration with two pseudo differential output terminals. The differential signal output from the two pseudo differential output terminals is transmitted to the second-order integrator, thus forming a dual feedback differential loop. The dual feedback differential loop can eliminate non-linear components of the class-D amplifier through second-order noise shaping operation, offer higher order noise shaping, improve signal to noise and distortion ratio (SNDR) and total harmonic distortion plus noise (THD+N), and adjust the differential signal more precisely.

Another objective of the present invention is to provide a single-ended class-D amplifier with reduced electromagnetic interference (EMI).

To achieve the objective, the output driver comprises a main driver having a high-side switch set and a low-side switch set, and a secondary driver having a high-side switch set and a low-side switch set. The number of the high-side switch set and the low-side switch set of the main driver is more than that of the secondary driver. The main driver and the secondary driver are connected in series at a node as the output terminal of the class-D amplifier.

The logic circuit produces two sets of PWM signals respectively applied to the main driver and the secondary driver. The first set of the PWM signals for the main driver is expressed by logic expressions N1=N2–X and P1=$\overline{X31N2}$, where X and N2 are generated by comparing the differential signal to an oscillating signal.

According to the logic expressions, if the class-D amplifier has no output signals, the reference signal X is identical to the signal N2. As a result, the logic circuit stops producing the PWM signals P1, N1. The main driver having more switches is deactivated. If the class-D amplifier has output signals, the main driver is partially activated to turn on the high-side switch set or the low-side switch set. Therefore, the switch loss and the output switch slew rate of the output driver are reduced, and the total electromagnetic interference (EMI) of the class-D amplifier is improved.

Other objectives, advantages and novel features of the invention will become more apparent from the following detailed description when taken in conjunction with the accompanying drawings.

DETAILED DESCRIPTION OF PREFERRED EMBODIMENT

Figure 1:
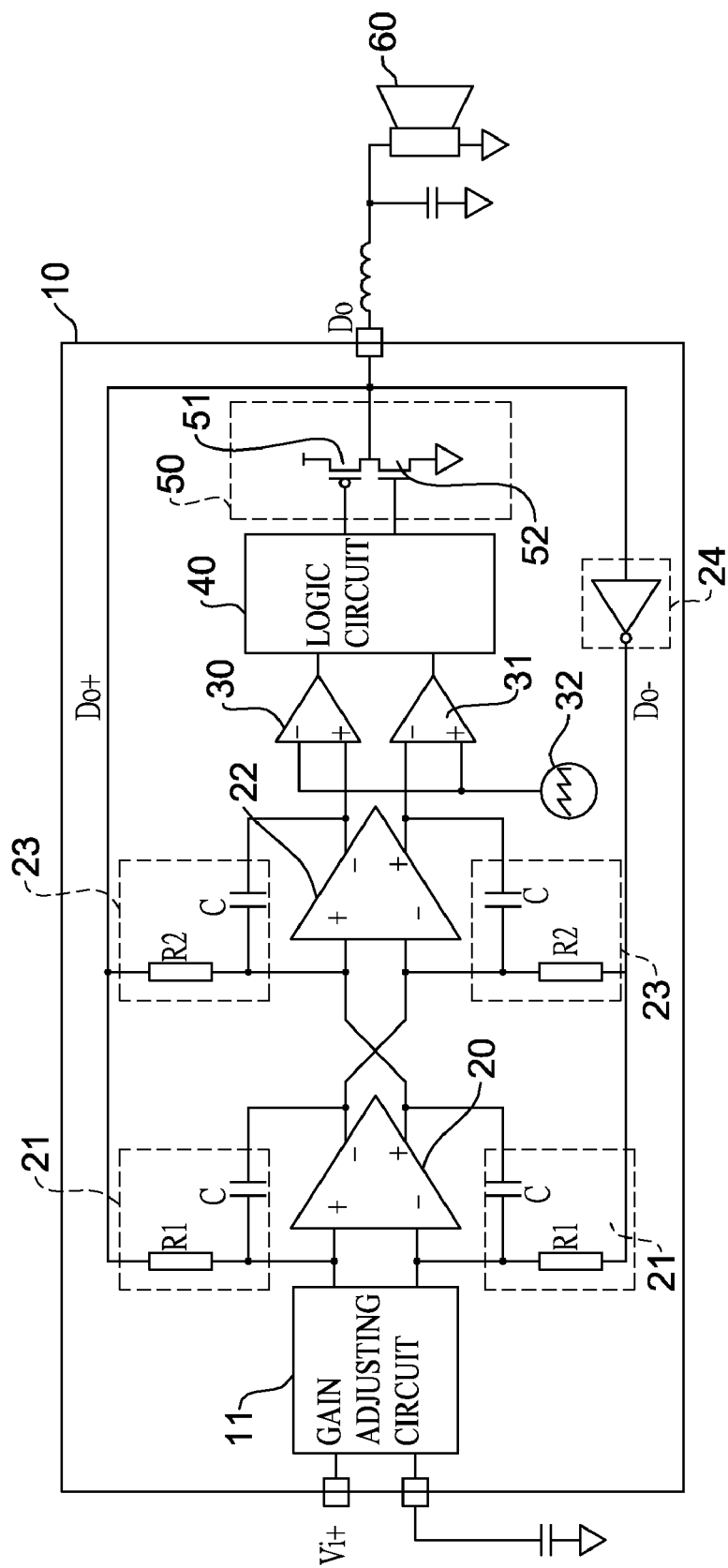
FIG. 1 is a circuit diagram of a first embodiment of a single-ended class-D amplifier with dual feedback loop scheme in accordance with the present invention.

With reference to FIG. 1, a single-ended class-D amplifier (10) with the dual feedback loop scheme in accordance with the present invention comprises a gain adjusting circuit (11), a second-order integrator, two comparators (30)(31), an oscillator (32), a logic circuit (40), an output driver (50) and an inverter (24).

The output driver (50) comprises a high-side switch set (51) and a low-side switch set (52) both connected in series at a node as an output terminal (Do) of the class-D amplifier (10).

The inverter (24) is connected to the output terminal (Do) of the class-D amplifier (10) to form pseudo differential output terminals (Do+)(Do−), i.e. the non-inverted output (Do+) and the inverted output (Do−). A differential signal is output from the pseudo differential output terminals (Do+)(Do−).

The second-order integrator comprises a first differential amplifier (20), two first RC circuits (21), a second differential amplifier (22) and two second RC circuits (23).

The first differential amplifier (20) has a non-inverting input (+), an inverting input (−), a non-inverting output (+) and an inverting output (−). The non-inverting input (+) and the inverting input (−) of the first differential amplifier (20) are connected to the gain adjusting circuit (11), so that a differential gain of the first differential amplifier (20) can be adjusted.

One of the first RC circuits (21) is connected between one pseudo differential output terminal (Do+) and the non-inverting input (−) of the first differential amplifier (20), while the other first RC circuit (21) is connected between the other differential output terminal (Do−) and the inverting input (−) of the first differential amplifier (20). The two first RC circuits (21) cooperate with the first differential amplifier (20) to form two first-order integrating circuits.

The second differential amplifier (22) has a non-inverting input (+), an inverting input (−), a non-inverting output (+) and an inverting output (−). The non-inverting input (+) of the second differential amplifier (22) is correspondingly connected to the non-inverting output (+) of the first differential amplifier (20). The inverting input (−) of the second differential amplifier (22) is correspondingly connected to the inverting output (−) of the first differential amplifier (20).

One of the second RC circuits (23) is connected between one pseudo differential output terminal (Do+) and the non-inverting input (−) of the second differential amplifier (22), while the other second RC circuit (23) is connected between the other differential output terminal (Do−) and the inverting input (−) of the second differential amplifier (22). The two second RC circuits (23) cooperate with the second differential amplifier (22) to form two second-order integrating circuits.

Figure 2:
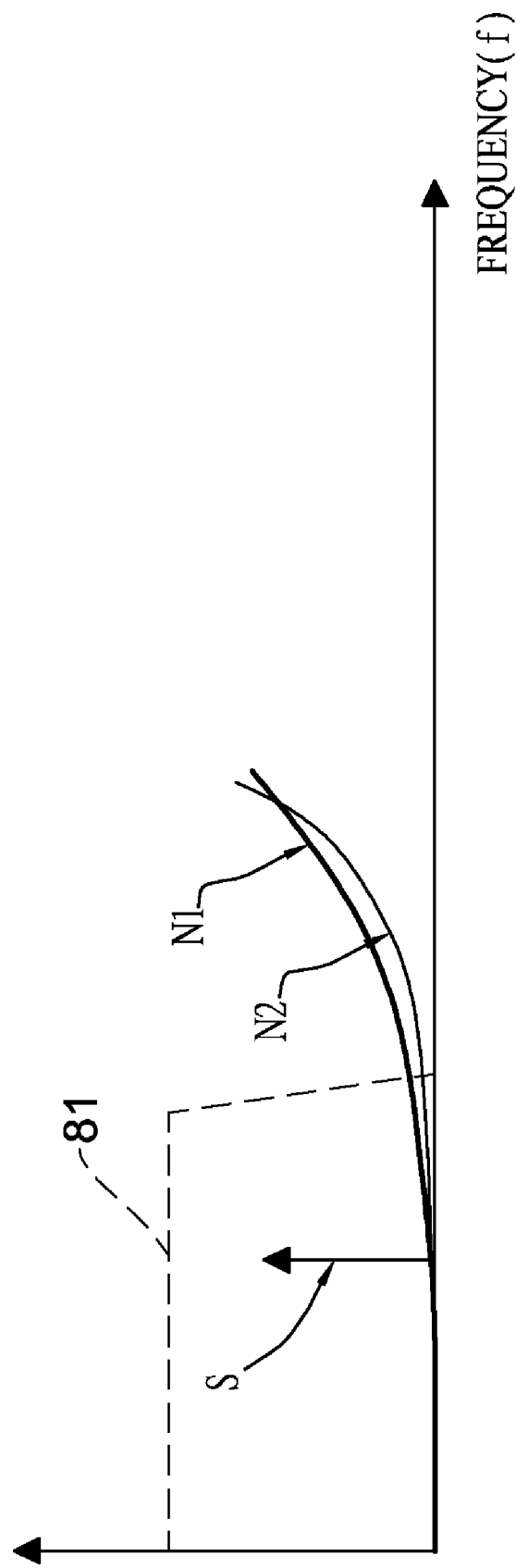
FIG. 2 is a diagram illustrating power spectrum of an amplified audio signal output by the single-ended class-D amplifier of FIG. 1.

With further reference to FIG. 2, by connecting the output terminal (Do) to the inverter (24), the class-D amplifier (10) offers the pseudo differential output terminals (Do+)(Do−) and constructs a fully differential circuit configuration. The fully differential circuit configuration further cooperates with the second-order integrator to form a second-order feedback architecture. The second-order feedback architecture can attenuate the noises of the two differential amplifiers (20)(22) and other non-linear components to provide higher order noise shaping and improve signal to noise and distortion ratio (SNDR). Furthermore, through the processing of the two differential amplifiers (20)(22), the differential signal output from the pseudo differential output terminals (Do+)(Do−) can be precisely adjusted.

In addition to the fully differential circuit configuration being integrated in the class-D amplifier (10) of the present invention, the first and second differential amplifiers (20)(22) are also incorporated to eliminate non-linear components. Therefore, total harmonic distortion plus noise (THD+N) of the class-D amplifier (10) can be improved. The fully differential circuit configuration also enhances some characteristic including power supply rejection ration (PSRR), the common mode rejection, and crosstalk noise rejection.

Figure 3:
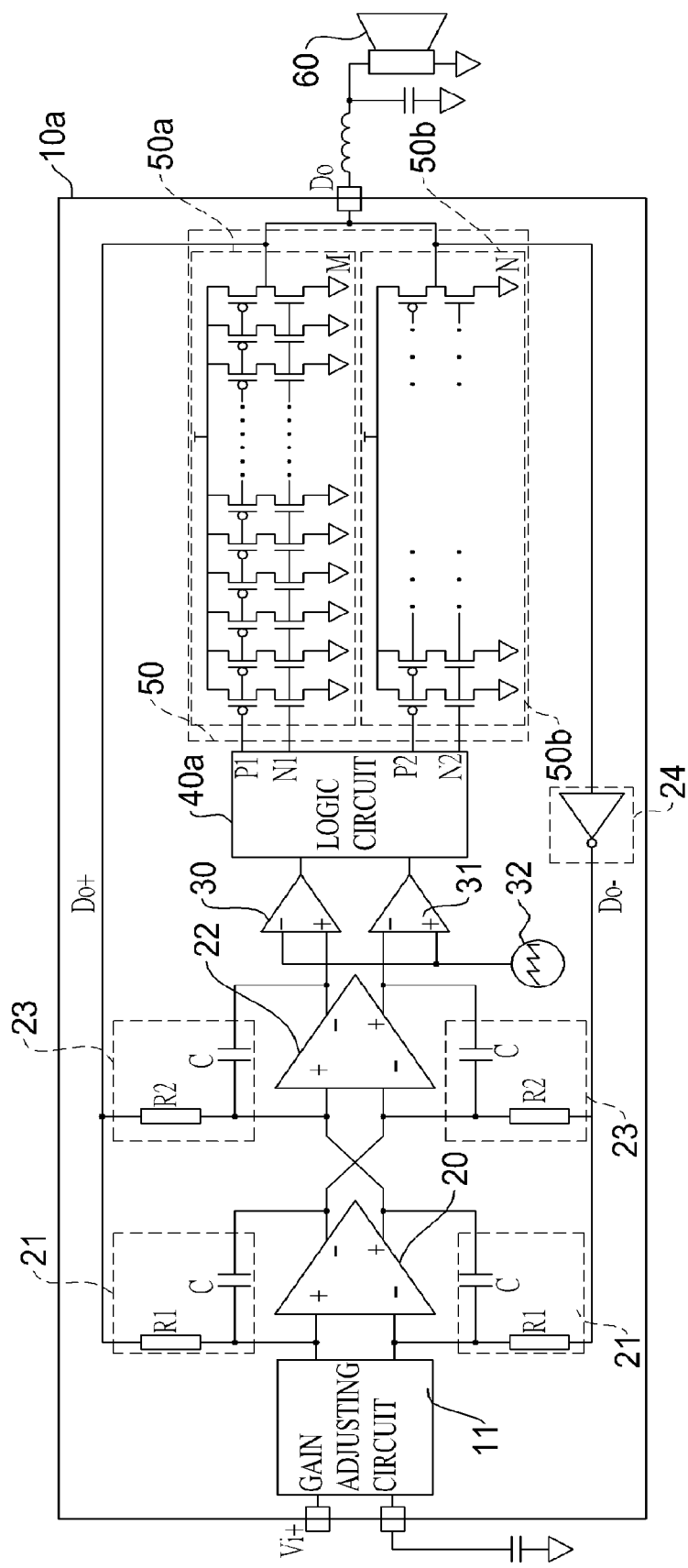
FIG. 3 is a circuit diagram of a second embodiment of a single-ended class-D amplifier with dual feedback loop scheme in accordance with the present invention.

With reference to FIG. 3, the output driver (50) of the class-D amplifier (10a) comprises a main driver (50a) and a secondary driver (50b). Each of the drivers (50a)(50b) comprises a high-side switch set and a low-side switch set, wherein the number (M) of the high-side switch set and the low-side switch set of the main driver (50a) is preferably more than the number (N) of the high-side switch set and the low-side switch set of the secondary driver (50b). In the preferred embodiment, the number M is a multiple of the number N; wherein M/N=n; n may be 3, 4 or 5.

The logic circuit (40a) further outputs two PWM signals (N1, P1) to control the main driver (50a), wherein the logic expressions of the PWM signals (N1, P1) are N1=N2−X and P1=$\overline{X-N2}$, where X and N2 are generated by comparing the differential signal to the oscillating signal.

Figure 4A:
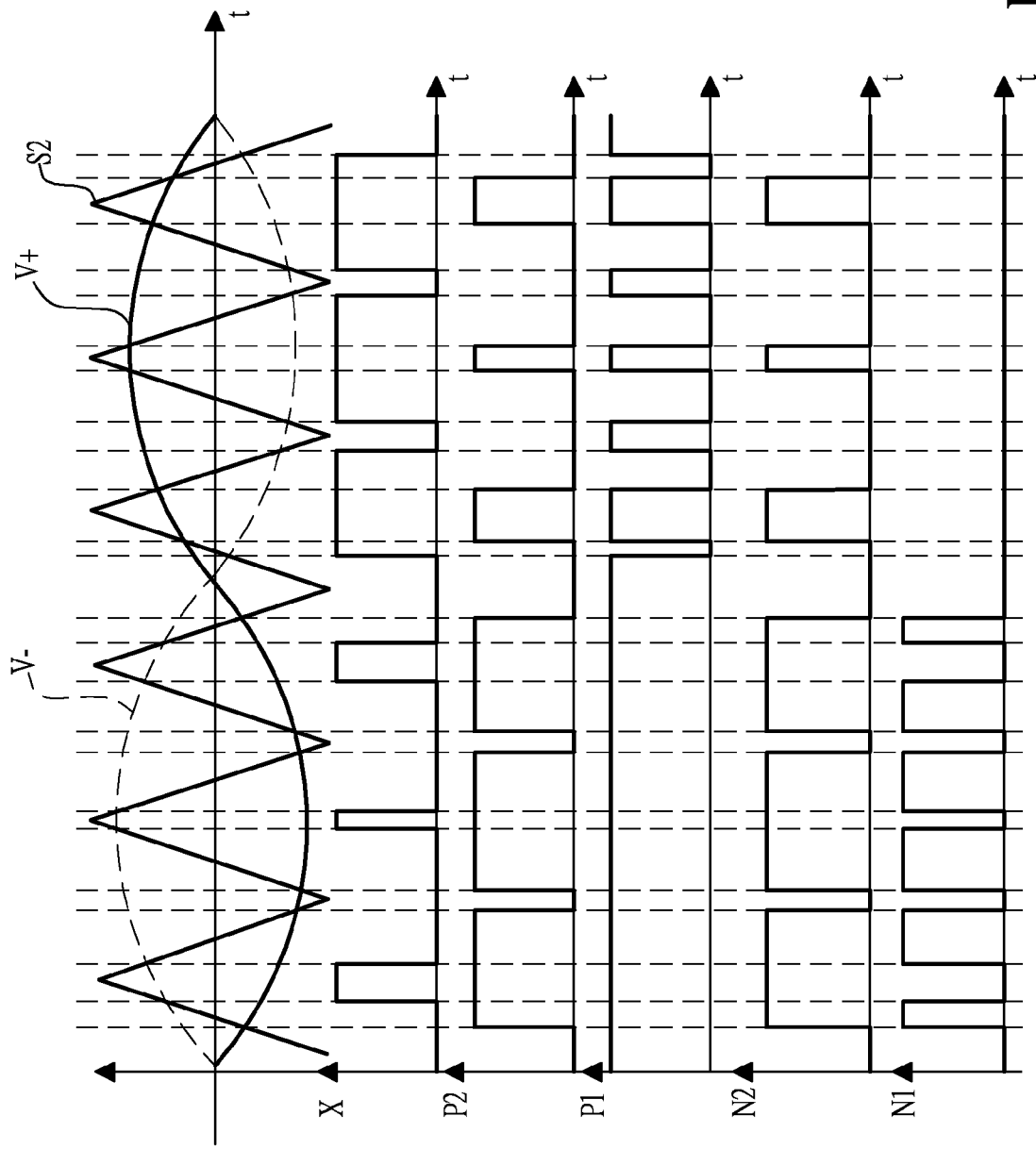
FIG. 4A is a waveform diagram illustrating multiple signals of the single-ended class-D amplifier of FIG. 3 when the class-D amplifier has output signals.

With further reference to FIG. 4A, with the dual feedback differential circuit configuration, the two comparators (30) (31) receive differential signals (V−)(V+) and compare them with the oscillating signals (S2) from the oscillator (32) to produce PWM signals (N2, P2) for the secondary driver (50b) and a reference signal (X) when the class-D amplifier (10a) outputs large signals. Upon receipt of the PWM signals (N2, P2), the logic circuit (40a) directly outputs the PWM signals (N2, P2) to the secondary driver (50b) and refers to the reference signal (X) to produce another set of PWM signals (N1,P1) for the main driver (50a) according to the foregoing logic expressions. When the class-D amplifier (10a) has the outputs signals, the high-side switch set or the low-side switch of the main driver (50a) is selectively activated at any time.

Figure 4B:
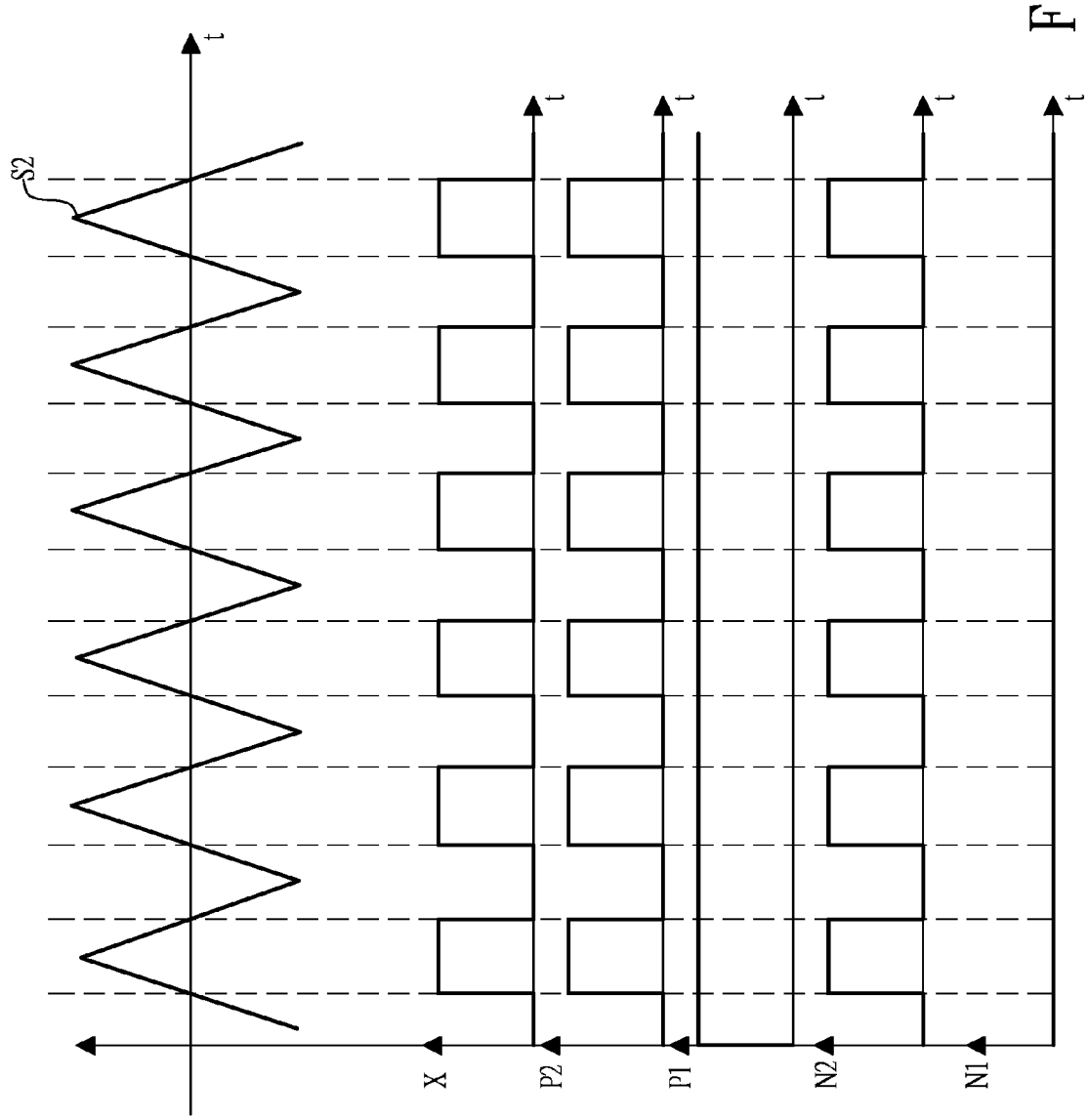
FIG. 4B is a waveform diagram illustrating multiple signals of the single-ended class-D amplifier of FIG. 3 when the class-D amplifier has no output signals.
Figure 5:
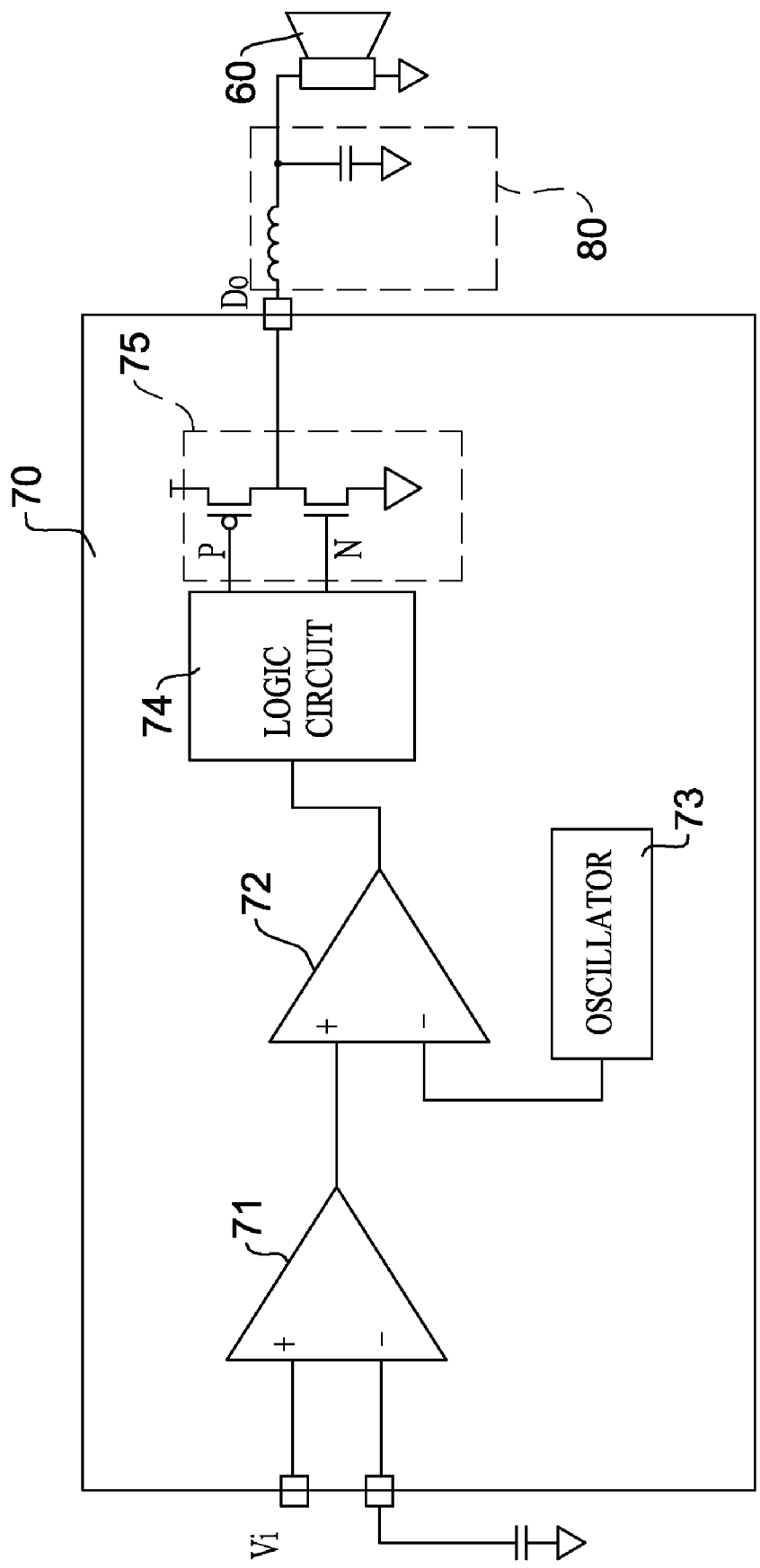
FIG. 5 is a circuit diagram of a conventional single-ended class-D amplifier.
Figure 6:
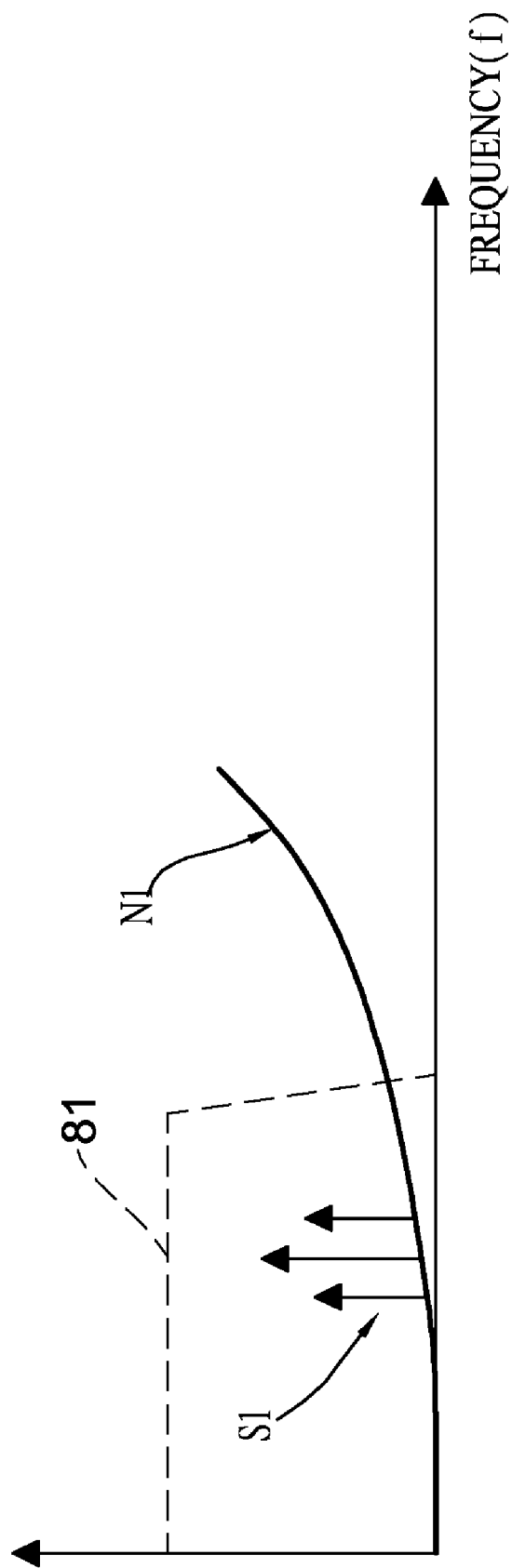
FIG. 6 is a diagram illustrating power spectrum of amplified audio signals output by the class-D amplifier of FIG. 5.
Figure 7:
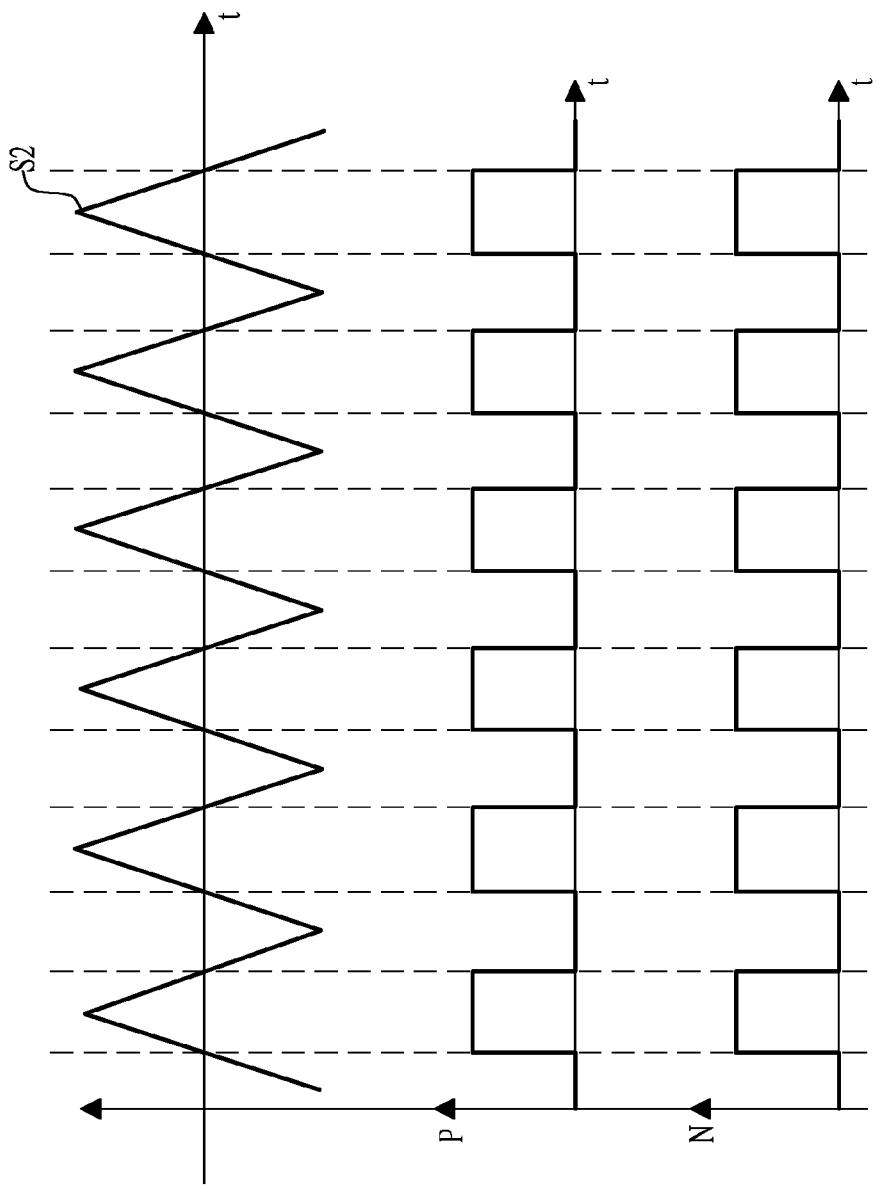
FIG. 7 is a waveform diagram illustrating signals of the single-ended class-D amplifier of FIG. 5.
Figure 8:
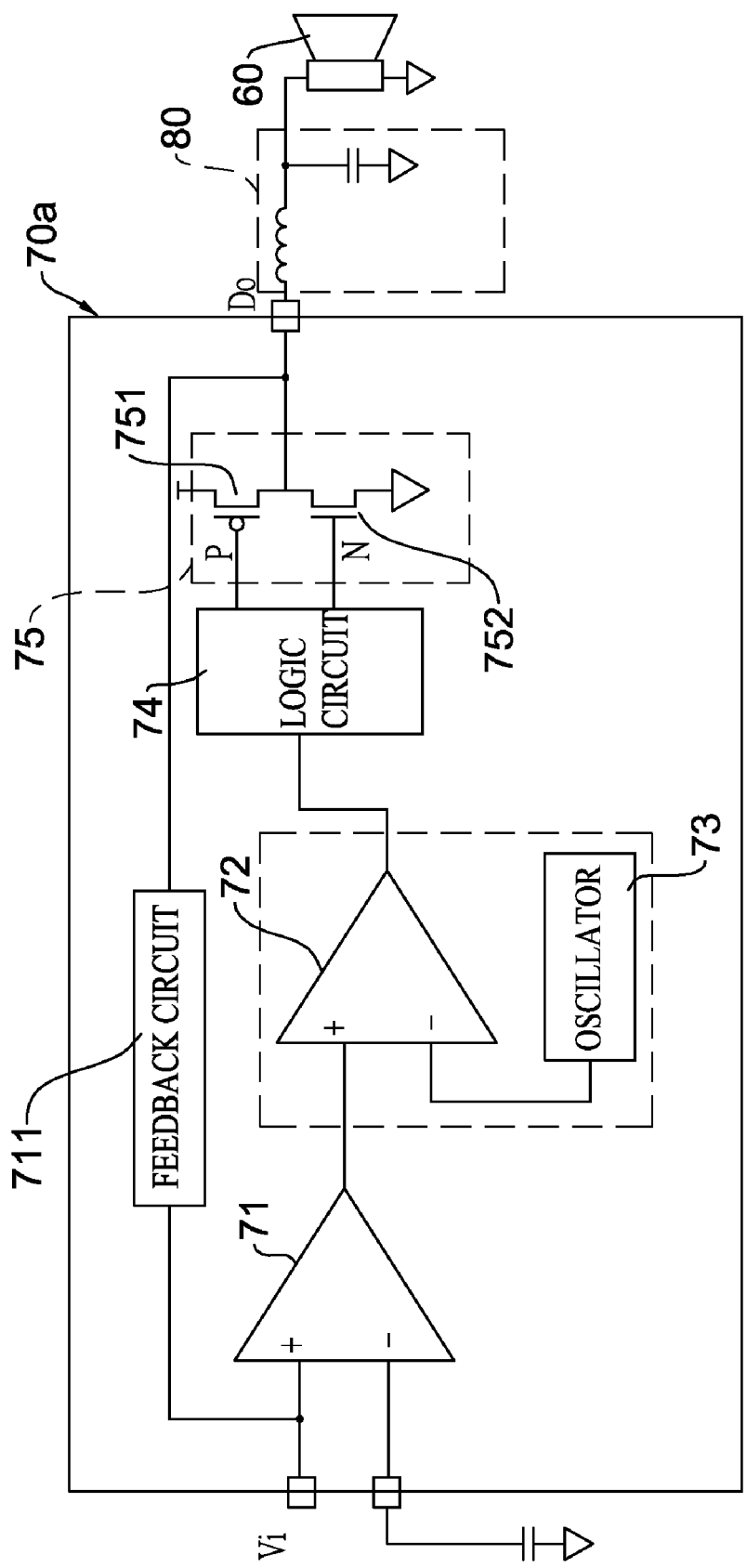
FIG. 8 is a circuit diagram of another conventional single-ended class-D amplifier.

With reference to FIG. 4B, when the class-D amplifier (10a) has no output signals, the reference signal (X) is identical to the signal (N2). As a result, the logic circuit (40a) does not provide PWM signals (P1, N1) to drive the high-side switch set and the low-side switch set of the main driver (50a). Depending on the output signals of the class-D amplifier (10a), the main driver (50a) can be deactivated or partially activated to turn on the high-side switch set or the low-side switch set. Therefore, the switch loss and the output switch slew rate of the output driver (50) are reduced. The total electromagnetic interference (EMI) of the class-D amplifier (10b) also can be improved.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A single-ended class-D amplifier with dual feedback loop scheme comprising:
    an output terminal connected to an inverter to form two pseudo differential output terminals that output a differential signal;
    a gain adjusting circuit;
    two comparators;
    an oscillator outputting an oscillation signal;
    a logic circuit connected to the two comparators;
    an output driver connected to the logic circuit; and
    a second-order integrator comprising:
        a first differential amplifier having a non-inverting input, an inverting input, a non-inverting output and an inverting output, wherein the non-inverting input and the inverting input are connected to the gain adjusting circuit;
        two first RC circuits, wherein one of the first RC circuits is connected between one of the pseudo differential output terminals and the non-inverting input of the first differential amplifier, while the other first RC circuit is connected between the other differential output terminal and the inverting input of the first differential amplifier; wherein the two first RC circuits cooperate with the first differential amplifier to form two first-order integrating circuits;
        a second differential amplifier having a non-inverting input, an inverting input, a non-inverting output and an inverting output, wherein the non-inverting input of the second differential amplifier is connected to the non-inverting output of the first differential amplifier, and the inverting input of the second differential amplifier is connected to the inverting output of the first differential amplifier; and
        two second RC circuits, wherein one of the second RC circuits is connected between one of the pseudo differential output terminals and the non-inverting input of the second differential amplifier, while the other second RC circuit is connected between the other differential output terminal and the inverting input of the second differential amplifier; wherein the two second RC circuits cooperate with the second differential amplifier to form two second-order integrating circuits.

2. The single-ended class-D amplifier as claimed in claim 1, the output driver comprising:
    a main driver having a high-side switch set and a low-side switch set; and
    a secondary driver connected to the main driver at a node as the output terminal, and having a high-side switch set and a low-side switch set;
    wherein a number of the high-side switch set and the low-side switch set of the main driver is more than that of the secondary driver.

3. The single-ended class-D amplifier as claimed in claim 2, wherein the logic circuit produces two sets of PWM signals respectively applied to the main driver and the secondary driver;
    wherein the first set of the PWM signals for the main driver is expressed by logic expressions N1=N2−X and P1=$\overline{X-N2}$, where X and N2 are generated by comparing the differential signal to the oscillating signal.

4. The single-ended class-D amplifier as claimed in claim 2, wherein the number of the high-side switch set and the low-side switch set of the main driver is three to five times more than that of the secondary driver.

5. The single-ended class-D amplifier as claimed in claim 3, wherein the number of the high-side switch set and the low-side switch set of the main driver is three to five times more than that of the secondary driver.

* * * * *